United States Patent [19]

Francis

[11] Patent Number: 4,539,090

[45] Date of Patent: Sep. 3, 1985

[54] CONTINUOUS ELECTROPLATING DEVICE

[76] Inventor: William L. Francis, 18 Chimney Wood, Floyd Knobs, Ind. 47119

[21] Appl. No.: 604,970

[22] Filed: Apr. 27, 1984

[51] Int. Cl.³ .............. C25D 17/00; C25D 17/06; C25D 17/28
[52] U.S. Cl. .............................. 204/198; 204/203; 204/224 R
[58] Field of Search .............. 204/198, 203, 224 R

[56] References Cited

U.S. PATENT DOCUMENTS

| | | | |
|---|---|---|---|
| 3,657,097 | 4/1972 | Baldock | 204/224 R |
| 3,835,017 | 9/1974 | Mentone | 204/224 R |
| 4,029,564 | 6/1977 | Higuchi | 204/224 R |
| 4,155,815 | 5/1979 | Francis | 204/198 |
| 4,377,461 | 3/1983 | Lovejoy | 204/198 |
| 4,401,522 | 8/1983 | Buschow | 204/203 |
| 4,405,431 | 9/1983 | Pfeifer | 204/224 R |

Primary Examiner—Thomas Tufariello
Attorney, Agent, or Firm—Edward M. Steutermann

[57] ABSTRACT

A device for continuously plating selected portions of objects including an electroplating bath, a conveyor disposed for movement above the electroplating bath where retainer devices are provided to be carried by the conveyor in spaced relation above the electroplating bath. The retainer devices include a base having a connector to connect the base to the conveyor so that the retainer is disposed between the conveyor and the electroplating bath where the base includes retaining device to releasably receive the object to be electroplated with the portion of the item to be electroplated extending downwardly from the bottom of the base to be received in the electroplating bath as the retainer moves with the conveyor.

14 Claims, 12 Drawing Figures

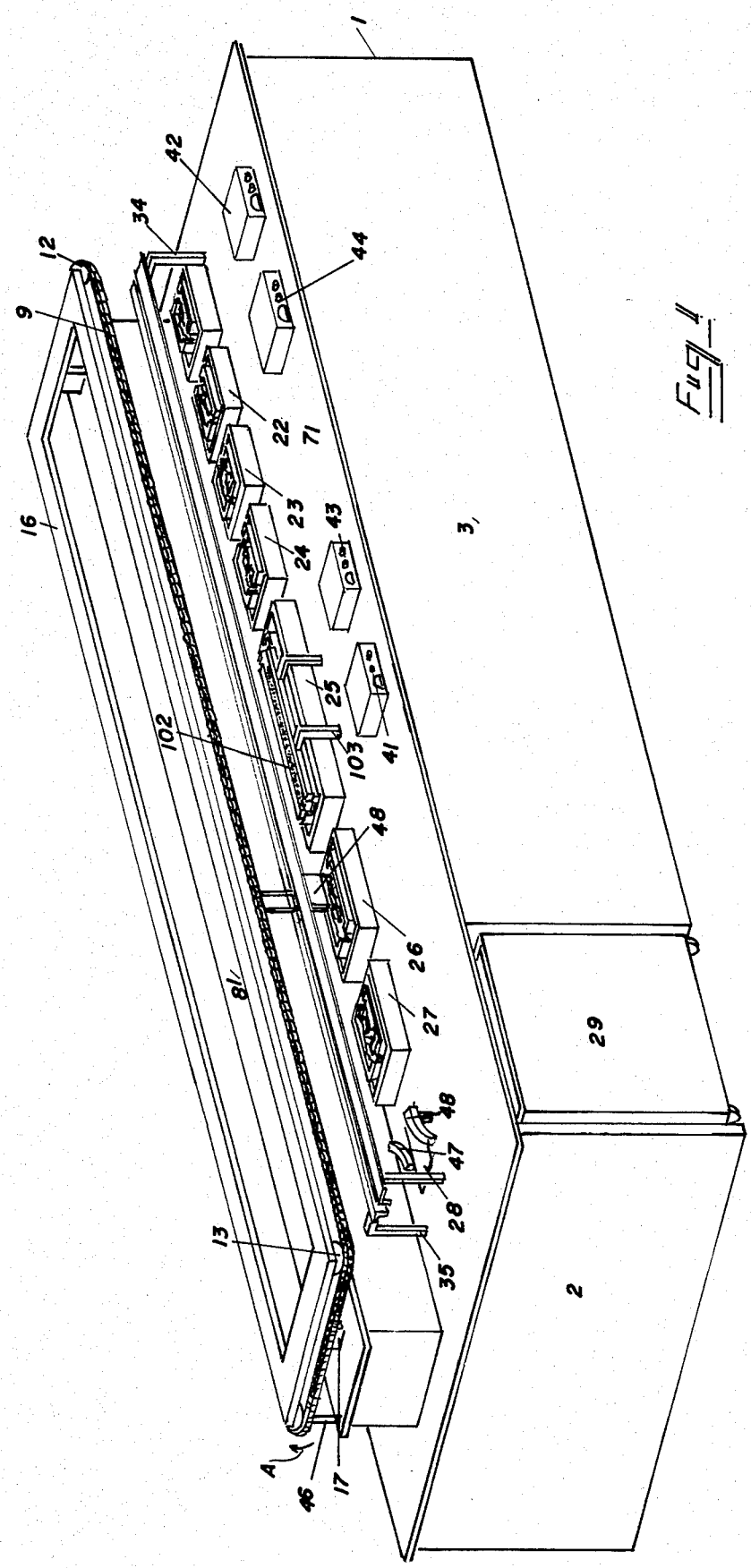

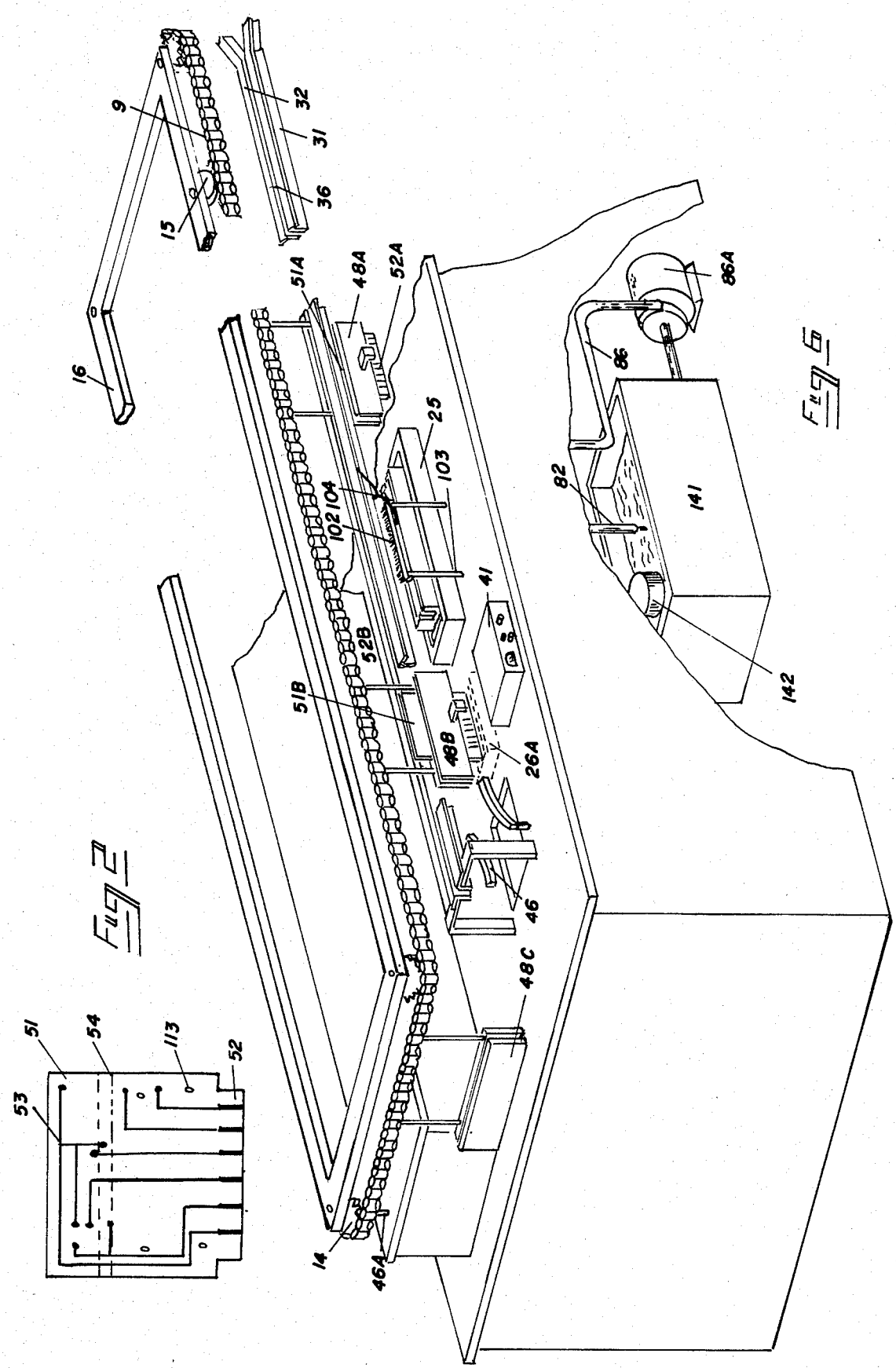

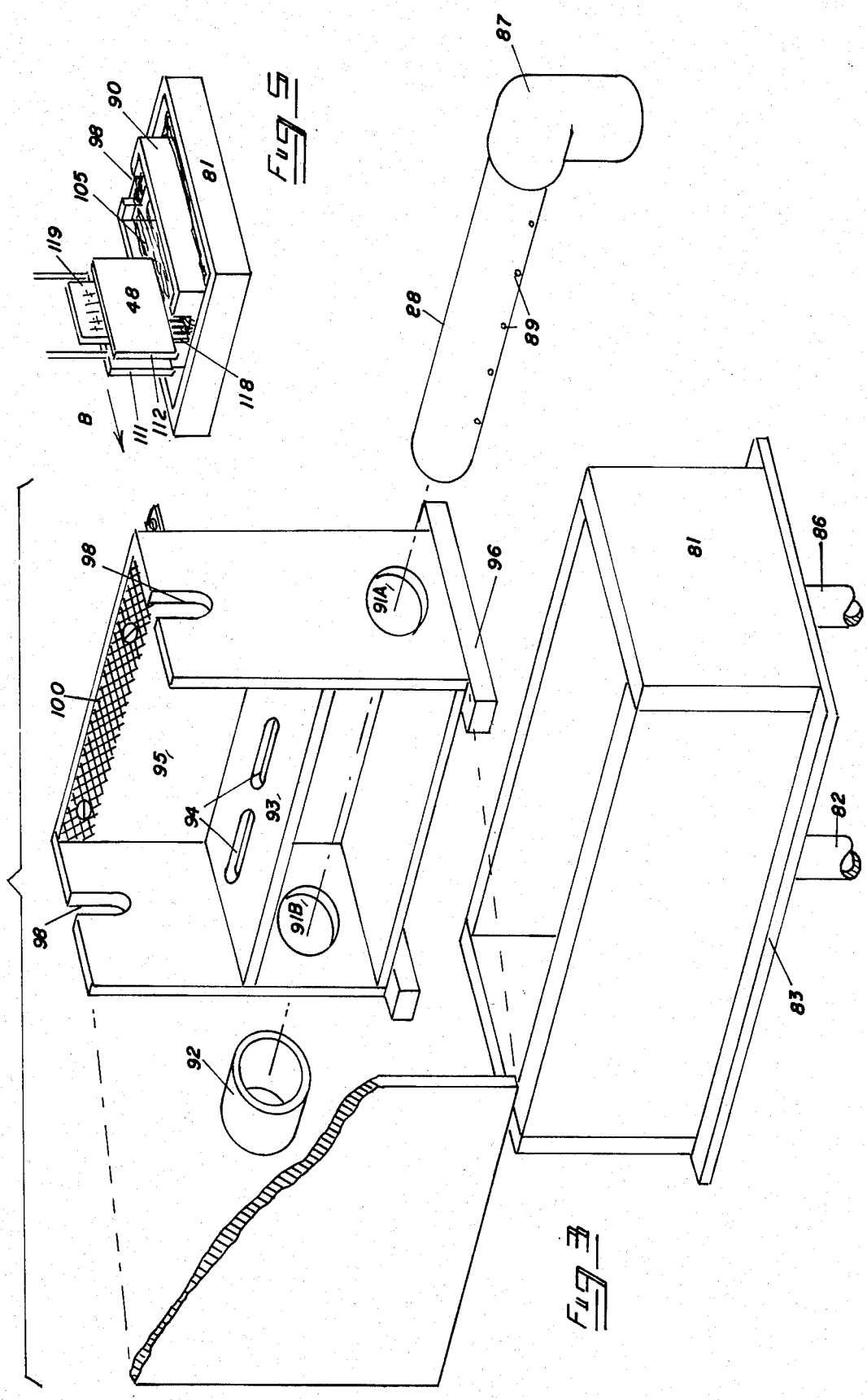

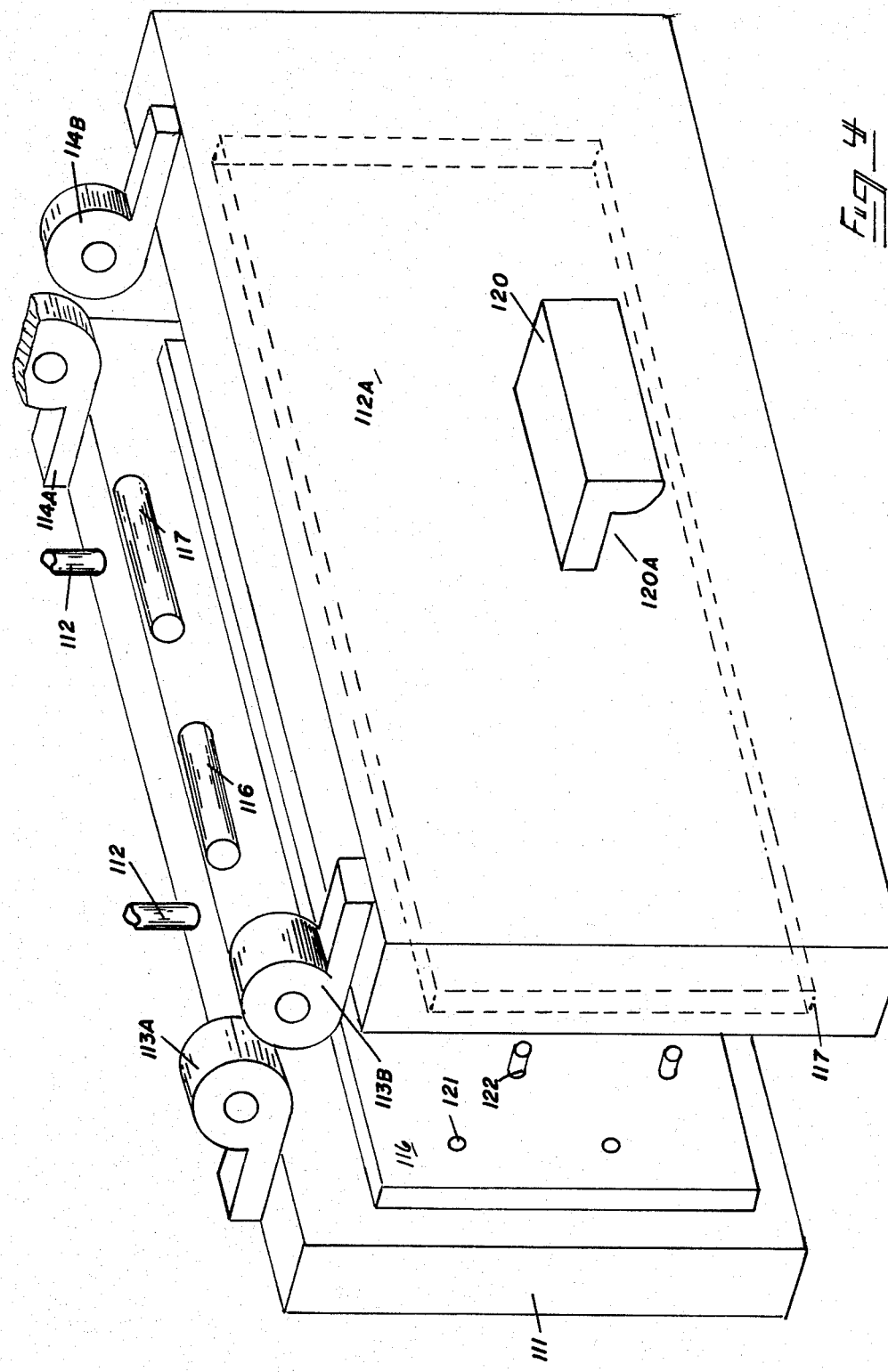

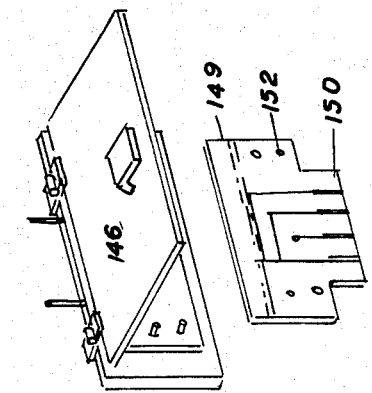
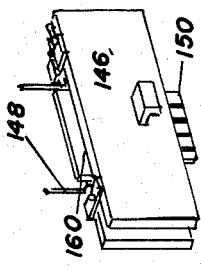
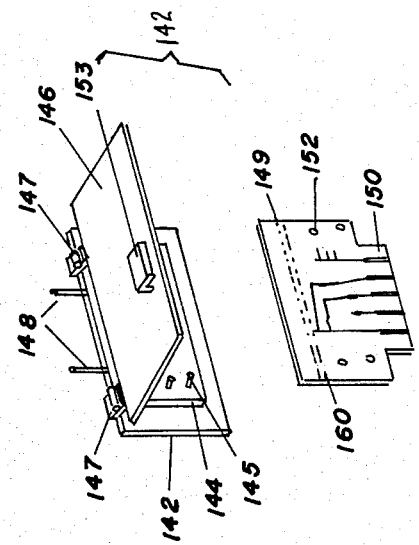
Fig. 7C
Fig. 7B
Fig. 7A

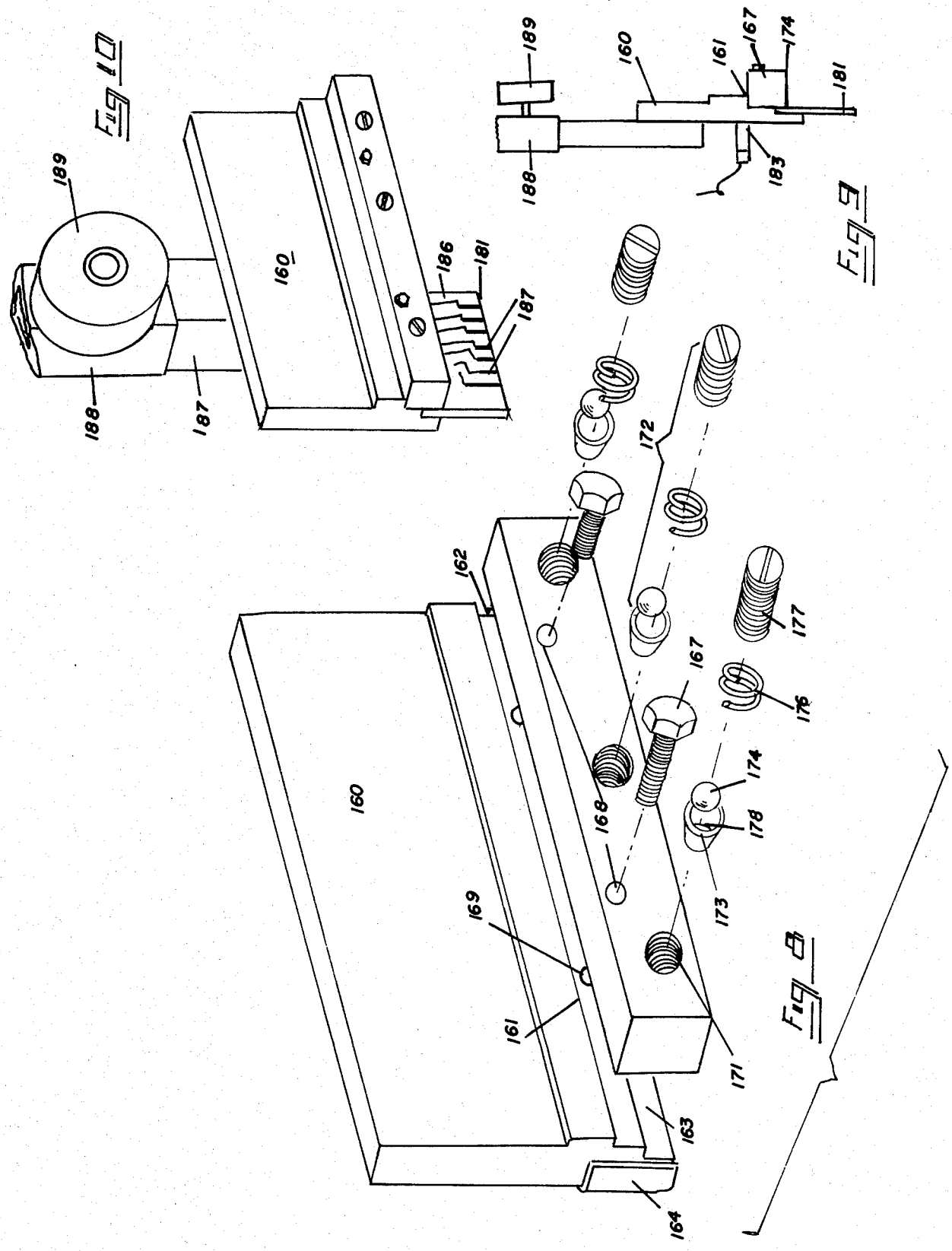

CONTINUOUS ELECTROPLATING DEVICE

BACKGROUND OF THE INVENTION

The present invention relates to the art of continuous electroplating and is particularly useful for plating terminals provided along one edge of an article, for example a printed circuit board, as is known in the art, as the board is conveyed through various stations for sequential processing.

It is well known in the art to electroplate edge terminals of printed circuit boards where the boards have cooperative terminals connected to "lands" for interconnection of the terminals to associated equipment. The electroplating is accomplished primarily with gold because of the effective corrosion resistance and resistance to erosion of the goldplated contact areas so that reliable electrical contact is maintained between the board components and the associated elements.

The prior art discloses means to cover portions of a printed circuit board with a thin synthetic film during electroplating of the terminals where peripherial portions of the boards are masked with adhesive tape to prevent undesired plating of certain areas of the board or electrically connecting the lands or damaging the lands. In such procedures the board is dipped in a level controlled electroplating solution which is electrically charged with electricity for plating. The procedure in general includes initially plating the terminals, for example with copper or nickel and finishing the plating with gold to provide sufficient electrical conductive properties and erosion resistance.

U.S. Pat. No. 4,029,564-Higuchi teaches a batch feed operation where terminals of printed circuit boards are gold plated, one board at a time. The reference utilizes mechanical masking means comprising a pair of opposed plates having a masking sheet on the sides thereof and pressure cylinder means co-acting with the plates for clamping the board therebetween to protect the portions of the board not requiring plating. The plating material is sprayed onto the board terminals for plating. The device disclosed in the prior art does not provide continuous movement of boards through the machine for complete processing nor does it provide quick equipment interchangability to handle processing of boards of various thickness and sizes.

U.S. Pat. No. 4,155,815-Francis, et al teaches a continuous plating machine utilizing a cooperating pair of endless tractor tread conveyor means to transport printed circuit boards through a plurality of process stations to complete the operation. The printed circuit boards are captured between the opposing shoes, or treads which serve as a masking means to protect the portions of the board which are not to be plated and the selected areas of the boards are electrically plated. The shoes themselves are supplied with an electrical potential opposite in polarity to the potential of the plating bath so that the electroplating circuit is closed.

The devices in accordance with U.S. Pat. No. 4,155,815 have proved entirely satisfactory in most applications however specialized applications have been found for which the improvements provided by the present invention are particularly useful.

SUMMARY OF THE INVENTION

The present invention provides a continuous plating machine, utilizing a conveyor and retainer arrangement to hold the object to be plated, for example, a printed circuit board, where the object is captured and aligned between the opposing sides of the retainer to guide a portion of the board, for example the terminals, through the plating solution. Heretofore, masking has been required to prevent the seepage of plating solution between the elements of a continuous belt and to prevent unwanted plating of certain areas, in the case of circuit boards to prevent interconnection of the lands.

Also, when the portions to be electroplated are pretreated as with acid, it is important to prevent exposure of the lands to the testing solution.

While the masking materials are in and of themselves relatively inexpensive it has been found that the use of masking materials over a long period of time and at high production volumes significantly increases cost of the electroplating operation.

Accordingly, the present invention provides new, novel and useful conveyor and retainer assemblies for use in continuous electroplating of materials such as a printed circuit board and more particularly the terminals of a printed circuit board to eliminate the need for masking off portions of the board.

The present invention further provides means for regulating the thickness of the electroplated portion and for efficiently and economically accomplishing the plating to provide high speed operation.

More particularly the present invention provides a device for continuously plating selected portions of objects including an electroplating bath, a conveyor disposed for movement above the electroplating bath where retainer devices are provided to be carried by the conveyor in spaced relation above the electroplating bath. The retainer devices include a base having a connector to connect the base to the conveyor so that the retainer is disposed between the conveyor and the electroplating bath where the base includes retaining device to releasably receive the object to be electroplated with the portion of the item to be electroplated extends downwardly from the bottom of the base to be received in the electroplating bath as the retainer moves with the conveyor.

BRIEF DESCRIPTION OF THE DRAWINGS

Examples in accordance with the present invention are illustrated in the accompanying drawings wherein:

FIG. 1 is a perspective view of an example of an arrangement within the scope of the present invention;

FIG. 2 is an plan view of one object, for example a printed circuit board which can be partially plated in the device of FIG. 1;

FIG. 3 is an exploded perspective view of an example of a solution bath useful in the device of FIG. 1;

FIG. 4 is a perspective view of an example of a retainer device within the scope of the present invention;

FIG. 5 is a perspective view illustrating in detail the relationship between the bath shown in FIG. 3 and the retainer shown in FIG. 4;

FIG. 6 is a more detailed view of a portion of a device similar to the device shown in FIG. 1;

FIGS. 7A–7C illustrate, sequentially the loading and unloading of an example of a retainer device within the scope of the present invention similar to that shown in FIG. 4;

FIG. 8 is an exploded view of another retainer device within the scope of the present invention;

FIG. 9 is a perspective view of the device shown in FIG. 8 in assembled form with a conveyor connector means; and FIG. 10 is an end view of the arrangement shown in FIG. 9.

DETAILED DESCRIPTION OF THE DRAWINGS

Referring first to FIG. 1 which is an illustration of an overall perspective view of an automatic plating machine a base 1 is provided with cover panels including, for example, panels 2 and 3 (and corresponding panels on the other sides of the device not shown). A top 7 is provided along with a shelf 8 supported by the frame assembly. A conveyor belt 9, which can, within the scope of the present invention be a roller chain is provided to travel around sprockets 12, 13, 14 and another sprocket (not shown) at opposite corners of a frame 16.

Also with reference to FIG. 6 idler sprockets 15 can be provided intermediate the ends of the device to facilitate orientation of chain 9 during operation. Sprockets 15 can be journaled in appropriate journals carried by frame 16.

Frame 16 is secured by brackets 17 at opposite ends of shelf 8 so that one run of conveyor 9 passes longitudinally over processing stations 21-27 as described hereinafter and a return run is provided on the opposite side of frame 16.

While various processing stations can be provided within the scope of the present invention to accomplish the electroplating, in the arrangement shown station 21 is an electroclean station, station 22 is a rinse bath, station 23 is an acid bath, station 24 is a rinse bath, station 25 is an electroplate bath, station 26 is a dragout bath for recovery of electroplating solution and station 27 is a final rinse bath. An aperture 28 is provided in top 7 to allow objects which have been electroplated to drop therethrough into a bins 29 for intermediate storage as described hereinafter.

As shown in FIG. 1 and in more detail in FIG. 6 guides 31,32 are provided and are supported by means of brackets 34,35 to define a pathway 36 therebetween to guide connectors 112 which connect the retainer to chain 9 to guide the part to be plated as described hereinafter.

In some instances it is necessary to control the temperature of the solution in the baths and it is particularly necessary to control the temperature of the solutions in the electroclean bath, at station 21 and the electroplating bath, at station 25. In this case temperature controllers 41 and 42 are provided to control the temperature of the liquid supplied to station 21 and to station 25. The circulation arrangement and solution temperature control as shown in FIG. 6 with respect to station 26 and described hereinafter. In the arrangement shown, electrolytic action occurs only at station 21 and station 25 and in this regard rectifiers 43 and 44 are provided to supply the direct current necessary for operation of these stations as is known in the art and described hereinafter.

Chain 9 can be driven in the direction shown by arrow A in FIG. 1 by means of a shaft 46 connected to a motor (not shown) which it will be understood can be a variable speed motor so that the processing time of objects to be electroplated can be regulated.

Cams 47 and 48 are provided at aperture 28 to facilitate removal of the objects which have been plated, from the retainers as described hereinafter.

Retainer assemblies shown generally by numeral 48 are provided on chain 9 and shown in more detail in FIGS. 4 and 6 and described hereinafter. It will be understood that in practice numerous retainers would be provided in spaced relation in chain 9.

FIG. 2 is an illustration of an object useful in the present invention, for example a circuit board 51, where it is desired to plate terminals 52 of the board. Board 51 includes lands 53 which are conductive and which are interconnected to terminals 52 as illustrated. As is known in the art circuit board 51 can be of a nonconductive material, for example a fiber reinforced plastic where the lands 53 are etched thereon and provided with innerconnections for assembly of electronic elements on the board. A contact area 54 is provided where electrical contact in this area is conducted to terminals 52 to facilitate electroplating of the terminals as described hereinafter by completion of an electrical circuit through the lands and terminals and its solution in the station where electrolytic action is to occur.

While various processing station configurations can be utilized, FIG. 3 is an illustration in perspective of one station cell useful in the arrangement shown. In the illustration of FIG. 3 an outer cell 81 is provided and can be generally rectangular. A drain 82 is provided from the center of a bottom 83 of cell 81 for emission of fluid from the cell. It will be understood that in the arrangement shown the solutions utilized in various stations flow continuously through the cells to maintain uniform composition.

Fluid enters the cell by means of a conduit 86 communicating with a source of fluid as described hereinafter and flows to an elbow 87 which communicates with a sparger 88 having apertures 89 therein which is advantageously located in the bottom of an innercell 90. Sparger 88 extends through inner apertures 91A-91B of cell 90 and carries a cap 92. As shown a baffle plate 93 can be provided within cell 90 above sparger 88 and has openings 94 to admit fluid to a chamber 95 to find above baffle 93. Standoffs 96 are provided beneath cell 90 to allow clearance beneath the bottom of inner cell 90 and the bottom 83 of outer cell 81 for overflow of liquid from cell 90 to drain 82.

FIG. 6 further illustrates a typical arrangement for recirculation of the fluid in a cell, for example station 25, where inlet 86 is illustrated as being from the outlet of a pump 86A and the return 82 is also illustrated. A reservoir 141 is provided having a heater 142 controlled by temperature regulator 141 to maintain the temperature of the fluid in reservoir 141 and in station 25.

Upwardly open grooves 98 are provided at opposite ends of cell 91 where the articles to be processed pass through the grooves 98 and liquid within innercell 90 overflows through the grooves to drain 82 for return. An anode connection 100 is provided within cell 90 but it will be understood that within the scope of the present invention various other anode arrangements can be utilized. It will be further understood that in the arrangement shown in FIG. 1 cells of the type previously described would be used in all of the stations but the anode connections would be provided only in the cells of stations 21 and 25 where electrolitic action occurs.

Referring to FIGS. 1 and 6 a conductive brush 102 is provided for station 25 and is positioned by means of arms 103. While not shown, it will be understood that a similar brush arrangement would be provided for station 21. The brush 102, and a similar brush provided for station 21 provide the cathode connection for the electrolitic action which occurs in stations 21 and 25. Specifically a lead 104 is provided to brush 102 to a cathode and a similar lead would be provided to the brush associated with station 21 so that an electrical circuit is completed from brush 102 through the object to be electroplated and the solution in cell 90 to anode 92 and current flow is regulated by rectifiers 43 and 44. In the arrangement shown brush 102 advantageously contacts the area 54 of a typical board 51 as illustrated in FIG. 2 so that the circuit is connected by means of the lands to each of the terminals 52 to facilitate electroplating thereof.

FIG. 5 is an illustration of the operation of a cell of the type shown in FIG. 3 where a retainer assembly 48 as described hereinafter is shown to position terminal section 118 to pass through grooves 98 of a cell 90 where the liquid 105 is provided in cell 90 and overflows outwardly through both of the grooves 98 into cell 81 for recirculation.

Movement of assembly 48 is illustrated by arrow B where the assembly 48 shown is passing out of cell 90.

Referring now to FIG. 4 which is an enlarged perspective view of one example of a retainer assembly within the scope of the present invention, and shown in smaller version in FIGS. 1 and 2 as retainer 48, a base 111 is provided having upwardly extending rods 112 which as shown in FIGS. 1 and 6, are connected to belt 9 to permit movement of the assembly with the belt. The length of rods 112 can, within the scope of the present invention, be adjustable to expose only a selected depth of an object to the fluid 105 in cell 90 as shown in FIG. 5. Pivots 113A, 113B and 114A and 114B are provided as shown. The pivots are interconnected by means of pins 116, 117 where the pivots 113B, 114B are attached to a cover 112A. Pivots 113A-B and 114A-B include spring means (not shown) to urge cover 112 toward base 111 so that faces of the cover and base close on each other. A mask 116 is provided on base 111 and a second mask 117 is provided on cover 112A in generally aligned relation with mask 116. The mask 116 and 117 can, for example, be of an elastomeric material so that the covers are pressed in sealing relation against an object which is retained between base 111 and cover 112A to prevent splashing of liquid material onto areas of the objects which are not to be electroplated during the process and so that only a selected portion 118 of the object is exposed to the solution as shown in FIG. 5. In FIG. 5 a circuit board 119 is retained in position between base 111 and cover 112.

Also within the scope of the present invention mask 116 can be provided with apertures 121 where the apertures extend through the mask and are in aligned relation with threaded apertures (not shown) in base 111. Pins 122 can be provided having a threaded end 122A so that the pin can be inserted through the apertures 121 and retained in base 111. With reference to FIG. 2 aperture 113 can be provided in circuit board 51 to receive pins 121 to hold the circuit board 51 in a selected aligned relation within the retainer assembly during the processing so that the selected terminal section 52 are exposed to the solutions in the cell of stations 21-27 as shown in FIG. 5. Preferably the length of pins 121 is determined so that the pins do not extend materially beyond the face of the board facing mask 117 so that the masks 116 and 117 are urged tightly against the opposite face of the board.

In this regard it is recognized that in many instances alignment of circuit boards for electroprocessing is tedious and difficult simply because the circuit boards may not be accurately trimmed and there is no base from which to position the boards during electroprocessing to accurately electroplate only the desired areas. The present invention provides means to overcome irregularities in the configuration of the circuit boards and to specifically align each circuit board in a similar manner regardless of the peripherial configuration of the board so long as the apertures 113 are accurately space. Clearly accurately spacing of the apertures 113 is more desirable and easier than the individual alignment of each board during processing. A follower 120 is provided on the outer surface of cover 112 for pivoting cover 112 with respect to base 111 as described hereinafter.

Referring again to FIG. 6 which illustrates only a portion of the device shown in FIG. 3, an assembly 48A is shown utilizing a retainer of the type shown in FIG. 4 where a board 51A is positioned in the retainer with terminals 52A extending downwardly therefrom. Assembly 48A in the arrangement shown is moving toward station 25 while stations 26 and 27 are shown in shadowline as numeral 26A.

Likewise assembly 48B with a circuit board 51B in position to expose terminals 52B is shown having been emitted from station 25 and passing to the stations represented by numeral 26A. A retainer assembly 48C is shown where the circuit board has been removed from between the cover and the base by the cam means shown as numerals 47 and 48 of FIG. 6. Cam 48 is provided to engage guide 120A of follower 120 provided on cover 112A as shown in FIG. 4 where the guide 120A engages the end of cam 48 to move cover 112A outwardly away from base 111 and release a circuit board captured therebetween. Base 111 is prevented from movement by means of rods 112 which are precluded from lateral movement by guides 31,32. Follower 120 rides on cam 48 until it overrides the cam and returns, by means of the springs included in pivots 113A-B and 114A-B to the position shown as assembly 48C. A second cam 47 can be provided where needed to push the circuit board off of the pins 122 and allow it to drop through aperture 28. The arrangement shown in FIG. 6 is somewhat different from the views shown in FIG. 1 to illustrate a different possible arrangement in that a shaft 46A is provided to drive sprocket 14 and shelf 8 has been eliminated so that brackets 17 are extended to be received on top 7.

Finally, FIGS. 7A-7C illustrate the sequence of loading, carrying, and removal of the circuit boards. In the arrangement shown in FIGS. 7A-7C a retainer assembly 142 within the scope of the present invention and similar to that illustrated in FIG. 4 is shown. A base 143 is provided having a mask 144 with pins 145. A cover 146 is shown where spring biased pivots 147 are provided to innerconnect the upper edges of base 142 and cover 146. Connector rods 148 are shown to connect the assembly to a chain similar to chain 9 of FIGS. 1 and 6. A circuit board 149 is shown having terminals 150 to be electroplated. Circuit board 149 further includes apertures 151 to receive pins 145 to hold the board in aligned relation during the operating sequence. In FIG. 7A the board is being loaded into the assembly 142 and after loading with cover 146 closed the arrangement is as shown in FIG. 7B with terminals 150 exposed. The area 160 for brush contact is also shown above the top of cover 146. This illustrates the configuration of the board and the retainer assembly during processing.

Finally, in FIG. 7C the follower 152 of cover 146 has engaged the cam 46 (FIG. 1) to open cover 146 outwardly and circuit board 149 has engaged cam 47 (FIG. 1) so that the circuit board is pushed off of pins 145 and drops through an aperture corresponding to aperture 28 of FIG. 1.

The location of the processing and unloading of retainer 142 as shown in FIGS. 7B and 7C is shown in FIGS. 1 and 6. It will be understood that the loading of the retainer, as shown in FIG. 7A can occur at any point between the ejection of the boards as shown in FIG. 1 and the return of the retainer to the processing station.

FIGS. 8-10 illustrate another retainer arrangement within the scope of the present invention which can be utilized in the arrangements shown in FIGS. 1 and 6 as substitutes for the retainer arrangements, for example 52B and 48A.

In FIG. 8 an exploded perspective view of the retainer arrangement is shown including a base 160 which has, for convenience, an alignment ridge 161 and a first recess 162 and a second recess 163. Base 164 can be of electrically conductive material such as copper, and a mask 160, for example an elastomeric material, can be provided to prevent electrical contact between that portion of the base and any electrodes. A cover member 166 is provided to extend generally the length of base 160 and to be received on recess 162 where bolts 167 are provided to extend through apertures 168 in cover 166 and be received in threaded apertures 169 in recess 162 to hold cover 166 in position against base 160.

Within the scope of the present invention spring biased retainer means are provided to urge the item to be plated, for example as shown in FIG. 2, against base 160 and in this case to hold the item against recess 163 of base member 160. In this respect, threaded apertures 171 are provided in cover 166. In this case three threaded apertures are shown, each to receive a spring biased bolt assembly 172 which includes an end cup 173, a ball member 174, a spring 176 which is received internally in a cavity (not shown) in a screw 177. In the assembled form the end cup 173 is attached to the end of the screw 177 with the ball 174 and the spring 176 located therein so that the ball extends outwardly through an aperture 178 in the end of the cap 173 where the ball extends into the space between the surface of cover 166 abutting recess 162 and toward the recess 163. Each of the assemblies 172 is located in one of the apertures 171.

FIG. 9 is an illustration of the arrangement in assembled form where a circuit board 181 similar to circuit board 52 of FIG. 2 is shown in position with the circuit board located in the space defined between the surface of cover 166 abutting recess 162 and the recess 163 of base 160.

As is shown in FIG. 10 the ball 174 extends into the space and urges the circuit board against the recess surface 163 of base 160 so that a portion of the board is in electrical contact with the base 163.

FIG. 10 further illustrates that an electrode, 183, for example a brush, can contact the back of base 160 when the part 181 to be electroplated is located within the electroplating cell, for example cell 25 of FIG. 1, so that the electrical current can flow from electrode 183 through the lands 186 of part 181 to the end pieces 187 which are to be electroplated. The base 160 is retained on an arm 187 which can be adapted to telescope into an arm 188 which is carried, for example, by chain 9 of the arrangement shown in FIG. 1. An adjustment handle 189 is provided utilizing a screw thread, as is known in the art, to adjust the position of arm 187 in arm 188 so that the proper height is provided to expose the ends 187 to the electroplating bath as the unit passes over the bath. Bolts 191 can be provided to retain the base 160 to arm 187 where bolts 191 are inserted through holes 165 of base 160 as shown.

It will be understood that the foregoing is but one example of method and apparatus within the scope of the present invention and that various other methods and apparatus also within the scope of the present invention will occur to those skilled in the art upon reading the disclosure set forth herein.

The invention claimed is:

1. A device for plating selected first portions of a selected item including an electroplating bath means, a conveyor disposed for movement above the electroplating bath, retainer devices provided to be carried by the conveyor in spaced relation above the electroplating bath, where the retainer devices include a base having a connector to connect the base to the conveyor so that the retainer is disposed between the conveyor and the electroplating bath; cover means provided to be positioned in facing relation to and hingedly connected to said base at the upper edge thereof to receive said item therebetween, and cover second portions of the item which are not to be electroplated; bias means carried by said cover means to urge said item against said base means so a portion of the item to be electroplated extends downwardly from the bottom of the base to be received in the electroplating bath and so said item is releasably retained between said cover means and said base means; and elastomeric base mask means covering a portion of the face of said base facing said cover and elastomeric cover mask means covering a portion of said cover facing said base means so said item to be electroplated is engaged by said base mask and said cover mask when said cover is in said normal position.

2. The invention of claim 1 including pin extending outwardly from said base means wherein said selected item includes aperture means to receive said pin means to align said item with respect to said cover means and said base means.

3. The invention of claim 1 including cam means cooperatively disposed with respect to said conveyor means and follower means carried by said cover means to engage said cam means to selectively pivot said cover means on said hinge means from said normal position to second position with said cover pivoted away from facing relation with said base means.

4. The invention of claim 1 wherein said conveyor means includes endless chain means carried by sprocket means journaled above said electroplating bath means.

5. The invention of claim 1 wherein said electroplating bath means includes at least two processing stations through which the portion of said item to be electroplated is passed.

6. The invention of claim 5 wherein said electroplating bath means includes reservoir means with a chamber defined by cooperating wall means having upwardly open groove means located in aligned relation on opposite sides of said wall means wherein said conveyor means is disposed to direct said portion of said item to be electroplated through said first and second groove means.

7. The invention of claim 6 including solution supply and control means to maintain a level of solution within said chamber so that said solution flows outwardly through said first and second upwardly open groove means at a level sufficient to provide contact between said first portion of said articles to be electroplated and said solution.

8. The invention of claim 5 wherein said reservoir means is located within second reservoir means to receive solution overflowing from said reservoir means.

9. The invention of claim 8 including sparger means disposed beneath said first and second upwardly open groove means to direct solution into said reservoir means whereby said solution overflow through said first and second groove means into said second reservoir means.

10. The invention of claim 7 including baffle means located transversely across said reservoir means between said sparger means and said first and second upwardly open groove means and having apertures therein to selectively direct flow of said solution with respect to said first and second groove means.

11. The invention of claim 1 wherein said base means is electrically conductive, said item to be electroplated has electrically conductive areas to be urged into contact with said base means and where said electrically conductive areas extend outwardly.

12. The invention of claim 11 including electrical means to contact said base means when said item to be electroplated is in engagement with said electroplating bath where said item to be plated includes electrically conductive areas contacting said base means at one end and said electroplating bath at the other end and electrode means to contact said base means when said item to be electroplated is located in said electroplating bath and said base means is electrically conductive so an electrically conductive path is established between said electrode and said electroplating bath through said electrically conductive areas of said item to be electroplated.

13. The invention of claim 12 wherein said item to be electroplated is a printed circuit board and said electrically conductive areas are electrically conductive strips on said circuit board.

14. A device for plating selected portions of a selected planar item including an electroplating bath means, a conveyor disposed for movement above the electroplating bath, retainer devices provided to be carried by the conveyor in spaced relation above the electroplating bath, where the retainer devices include a base having a connector to connect the base to the conveyor so that the retainer is disposed between the conveyor and the electroplating bath and cover means fixed in spaced relation from said base means to define slot means between said base means and said cover means so said item to be electroplated is located in said slot means and where said cover means includes spring biased detent means extending through said cover means into said slot means where said detent means are spring biased for movement transverse to the plane of said base means and toward said base means to engage items to be electroplated located in said slot means and urge said items to be electroplated to engagement with said base means.

* * * * *